United States Patent
Uchimi et al.

(10) Patent No.: US 7,416,687 B2
(45) Date of Patent: Aug. 26, 2008

(54) ELECTROCONDUCTIVE PASTE COMPOSITION AND PRINTED WIRING BOARD

(75) Inventors: Tsutomu Uchimi, Tokyo-To (JP); Masayuki Nagashima, Tokyo-To (JP); Masaru Kobayashi, Tokyo-To (JP); Hiroyuki Shirogane, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 11/693,779

(22) Filed: Mar. 30, 2007

(65) Prior Publication Data
US 2007/0228336 A1 Oct. 4, 2007

(30) Foreign Application Priority Data
Mar. 31, 2006 (JP) .............................. 2006-097825

(51) Int. Cl.
*H01B 1/22* (2006.01)
*H05K 3/12* (2006.01)

(52) U.S. Cl. ...................................... 252/512; 252/514

(58) Field of Classification Search .......... 252/512–514
See application file for complete search history.

(56) References Cited

U.S. PATENT DOCUMENTS

| | | | | |
|---|---|---|---|---|
| 4,765,929 A | * | 8/1988 | Shaffer | 252/511 |
| 6,083,426 A | * | 7/2000 | Shimasaki et al. | 252/500 |

FOREIGN PATENT DOCUMENTS

| | | |
|---|---|---|
| JP | 06-350258 | 12/1994 |
| JP | 09-282937 | 10/1997 |
| JP | 09-286924 | 11/1997 |
| JP | 11-306860 | * 11/1999 |
| JP | 2001-011388 | 1/2001 |
| JP | 2002-270033 | 9/2002 |
| JP | 2003-077337 | 3/2003 |
| JP | 2003-331648 | 11/2003 |
| JP | 2004-265826 | 9/2004 |

* cited by examiner

*Primary Examiner*—Mark Kopec
(74) *Attorney, Agent, or Firm*—Burr & Brown

(57) ABSTRACT

There is provided an electroconductive paste composition that can form a coating film having satisfactory thickness by single coating work. The electroconductive paste composition can form bumps having satisfactory height even by a smaller number of times of coating than that in the prior art technique. The electroconductive paste composition comprises a phenolic resin, a melamine resin, an electroconductive powder, a solvent, and a bump forming aid comprising a monohydric alcohol having a terminal methoxy group and having at least one ether bond. The electroconductive paste composition can be used in a printed wiring board.

8 Claims, No Drawings

ELECTROCONDUCTIVE PASTE COMPOSITION AND PRINTED WIRING BOARD

TECHNICAL FIELD

The present invention relates to a novel electroconductive paste composition and a printed wiring board. Preferably, the present invention relates to an electroconductive paste composition suitable particularly for the formation of electrode bumps for use in interlayer connection in a multilayer printed wiring board, and a printed wiring board using the electroconductive paste composition.

BACKGROUND ART

Electroconductive paste compositions have hitherto been used in the field of electronics for various applications such as IC circuits, electroconductive adhesives, and electromagnetic wave shields. In particular, the following production process of a printed wiring board has recently been proposed. In the production process, a first board having conical electroconductive bumps, formed using an electroconductive paste, at predetermined positions of its at least one side is provided. Further, a second board having a wiring pattern on its at least one side is provided. The first and second boards are placed so that the electroconductive bump side of the first board inwardly faces the wiring pattern side of the second board. An insulator layer is disposed between the first and second boards to constitute a laminate assembly. The assembly is then lamination pressed to allow the bumps to pass through the insulator layer in its thicknesswise direction to form an electroconductive wiring part (Japanese Patent Laid-Open No. 350258/1994).

Further, a proposal has been made on an electroconductive paste composition for interlayer connection in a printed wiring board, comprising a melamine resin, a phenolic resin, an epoxy resin, an electroconductive powder, and a solvent, the epoxy resin having a softening point of 80° C. or above and 130° C. or below (Japanese Patent Laid-Open No. 270033/2002). The claimed advantage of the electroconductive paste composition is to provide an electroconductive paste that can prepare bumps having good prepreg penetration, does not cause cracking and breaking upon the penetration and pressing, and can realize large adhesive strength between the bump and a wiring pattern after the penetration, and, in the manufacture of a printed wiring board comprising a throughhole-type electroconductive wiring part, can realize high yield and good connection reliability.

Further, in order to provide an adhesive paste composition for interlayer connection in a printed wiring board which can form bumps having high hardness and free from cracking and poor connection with a wiring pattern, a proposal has been made on an electroconductive paste composition for interlayer connection in a printed wiring board, characterized by comprising at least a resin, selected from melamine resins, phenolic resins, and epoxy resins, an electroconductive powder, and a dihydric alcohol and/or trihydric alcohol with a boiling point of 180° C. or above (Japanese Patent Laid-Open No. 77337/2003).

An electroconductive resin composition characterized by comprising a water-soluble heat curable resin, electroconductive particles, and a dihydric alcohol is known as an example of a heat curable electroconductive resin composition that does not cause any problem even when an apparatus, a tool and a vessel are washed with water after screen printing (Japanese Patent No. 3588400).

As with Japanese Patent No. 3588400, Japanese Patent Laid-Open No. 286924/1997 discloses an electroconductive resin composition which does not cause any problem even when a screen plate and the like are washed with water after printing. The electroconductive resin composition comprises a water soluble thermoplastic resin, electroconductive particles having an average particle diameter of 0.05 to 50 μm, and a dihydric alcohol.

Japanese Patent Laid-Open No. 11388/2001 discloses an electrode paste composition for a stacked capacitor, which does not cause any problem even when a plate used for printing is washed with water. The electrode paste composition comprises a water soluble resin and glycols.

Japanese Patent Laid-Open No. 331648/2003 and Japanese Patent Laid-Open No. 265826/2004 disclose a metal paste, which can realize firing at a low temperature, comprising an organometal compound of a group 3 to 15 metal of the periodic table and an alcohol compound, preferably glycols.

The formation of electrode bumps by the method as described in Japanese Patent Laid-Open No. 350258/1994 is disadvantageous in that, when the electroconductive paste compositions as disclosed in patent documents Japanese Patent Laid-Open No. 270033/2002 and Japanese Patent Laid-Open No. 77337/2003 are used, bumps having a height large enough to penetrate the insulating layer cannot be formed by single coating work of the electroconductive paste composition and, thus, overprinting by repeating a plurality of times of coating work of the electroconductive paste composition was necessary. In particular, a paste, which forms bumps not having an excessively sharp tip, should be used for avoiding breaking or chipping of the bump during the penetration and pressing of the insulating layer, and, thus, satisfactory bump height could not be provided. Accordingly, in most cases, the number of times of overprinting should be increased.

The techniques described in Japanese Patent No. 3588400, Japanese Patent Laid-Open No. 286924/1997 and Japanese Patent Laid-Open No. 11388/2001 use water soluble resins, and the techniques described in patent documents Japanese Patent Laid-Open No. 331648/2003 and Japanese Patent Laid-Open No. 265826/2004 use firing-type metal pastes. Unlike these techniques, the electroconductive paste composition according to the present invention is of a water insoluble and non-firing-type and can realize satisfactory coating thickness by single coating work. So far as the present inventors know, such electroconductive paste composition has not hitherto been provided.

An object of the present invention is to solve the above problems of the prior art mainly by using a bump forming aid containing a specific compound.

SUMMARY OF THE INVENTION

Thus, according to the present invention, there is provided an electroconductive paste composition comprising: a phenolic resin; a melamine resin; an electroconductive powder; and a bump forming aid comprising a monohydric alcohol having a terminal methoxy group and having at least one ether bond.

In a preferred embodiment of the present invention, in the electroconductive paste composition, said bump forming aid has an ethylenedioxy moiety in its molecular structure.

In a preferred embodiment of the present invention, in the electroconductive paste composition, the bump forming aid is at least one member selected from the group consisting of 2-methoxyethanol, diethylene glycol monomethyl ether, and triethylene glycol monomethyl ether.

In a preferred embodiment of the present invention, the electroconductive paste composition further comprises at least one solvent selected from the group consisting of butyl carbitol acetate, ethyl acetate, butyl acetate, ethylcellosolve, butylcellosolve, ethyl carbitol, butyl carbitol, isopropanol, butanol, terpineol, texanol, butylcellosolve acetate and isophorone.

In a preferred embodiment of the present invention, in the electroconductive paste composition, the content of the bump forming aid is 0.1 to 50% by mass based on 100% by mass in total of the bump forming aid and the solvent.

In a preferred embodiment of the present invention, the electroconductive paste composition further comprises a pigment, preferably an extender pigment.

According to the present invention, there is also provided a printed wiring board characterized by using the above electroconductive paste composition.

The electroconductive paste composition according to the present invention can form a coating film having satisfactory thickness by single coating work.

Accordingly, bumps having satisfactory height can be formed by a smaller number of times of coating work than the prior art techniques.

Thus, the electroconductive paste composition according to the present invention can reduce the necessary number of times of overprinting of the electroconductive paste composition and can realize improved productivity. Further, the electroconductive paste composition according to the present invention is of a non-firing type and thus does not require any firing work.

DISCLOSURE OF THE INVENTION

<Electroconductive Paste Composition>

The electroconductive paste composition according to the present invention comprises: a phenolic resin; a melamine resin, an electroconductive powder; and a bump forming aid comprising a monohydric alcohol having a terminal methoxy group and having at least one ether bond. Here it should be noted that the term "comprising" means that the electroconductive paste composition according to the present invention does not exclude an electroconductive paste composition containing other components in addition to the above indispensable components, that is, a phenolic resin, a melamine resin, an electroconductive powder, and a bump forming aid. That is, the electroconductive paste composition according to the present invention includes both an electroconductive paste composition consisting of the above indispensable components only and an electroconductive paste composition comprising other components in addition to the above indispensable components. The term "electroconductive" means that the volume resistivity is not more than $1 \times 10^{-3}$ cm·Ω.

Preferably, the electroconductive paste composition according to the present invention has a viscosity of 80 to 300 Pa·s, particularly preferably 90 to 200 Pa·s. This viscosity is a value as measured with a spiral viscometer manufactured by MALCOM under conditions of 10 rpm/min and 25° C.

Preferably, the electroconductive paste composition according to the present invention has a thixotropic index of 0.5 to 1.0, particularly preferably 0.55 to 0.8. This thixotropic index is a value calculated from the viscosity of the electroconductive paste as measured with a spiral viscometer manufactured by MALCOM under conditions of 10 rpm/min and 5 rpm/min and 25° C. by a thixotropic index calculation formula log(viscosity value at 5 rpm/viscosity value at 10 rpm)/log[10 (rpm)/5 (rpm)]. The thixotropic index is one index representing such a property that standing results in increased apparent viscosity while vigorous mixing results in lowered apparent viscosity which facilitates coating.

(1) Phenolic Resin

In the present invention, either novolak-type or resol-type phenolic resins may be utilized as the phenolic resin. In particular, preferred phenolic resins include resins produced by conducting addition and condensation between a compound containing a phenolic hydroxyl group, such as phenol, cresol, xylenol, poly-p-vinylphenol, p-alkylphenol, chlorophenol, bisphenol A, phenolsulfonic acid, or resorcin, and aldehydes such as formalin or furfural. Among them, poly-p-vinylphenol is particularly preferred.

(2) Melamine Resin

Preferred melamine resins usable in the present invention include, for example, methylolmelamine and alkylated melamine.

(3) Electroconductive Powder

Electroconductive powders usable in the present invention include various electroconductive fine powders, for example, metal powders such as silver powder, gold powder, copper powder, nickel powder, platinum powder, palladium powder, solder powder, and powders of alloys of the above metals. These electroconductive powder may be used in combination of two or more. Further, electroconductive powders, other than metal powders, for example, carbon powder, may also be used. The electroconductive powder may have been surface treated.

The electroconductive powder may be in any form and have any size so far as the object of the present invention can be attained. In the present invention, for example, dendritic, flaky, spherical, and flaky electroconductive powders may be used, and a mixture of flaky electroconductive powder with spherical electroconductive powder is particularly preferred. The average particle diameter is preferably 0.5 to 10 μm, particularly preferably 1.0 to 5.0 μm.

(4) Bump Forming Aid

The electroconductive paste composition according to the present invention comprises a bump forming aid comprising a monohydric alcohol having a terminal methoxy group (—O—CH$_3$) and having at least one ether bond (C—O—C). Here the ether bond (C—O—C) based on (—O—) present in the methoxy group (—O—CH$_3$) is regarded as one ether bond. Accordingly, for example, a monohydric alcohol having only one terminal methoxy group and not having other ether bond (C—O—C) is defined as a monohydric alcohol having a terminal methoxy group (—O—CH$_3$) and having one ether bond (—O—). A compound having only one terminal methoxy group and one ether bond (C—O—C) not based on (—O—) present in the methoxy group is defined as a monohydric alcohol having a terminal methoxy group (—O—CH$_3$) and two ether bonds (C—O—C).

In the present invention, bump forming aids comprising a monohydric alcohol containing an ethylenedioxy moiety (—O—CH$_2$—CH$_2$—O—) in the molecular structure thereof and having a terminal methoxy group and an ether bond are particularly preferred. Here (—O—) present in the ethylene dioxy moiety may be based on or may not be based on (—O—) in the terminal methoxy group (—O—CH$_3$).

Specific examples of preferred compounds as the bump forming aid in the present invention include 2-methoxyethanol, diethylene glycol monomethyl ether, triethylene glycol monomethyl ether, and 1,3-dimethoxy-2-propanol. Among them, 2-methoxyethanol, diethylene glycol monomethyl ether, and triethylene glycol monomethyl ether are particularly preferred. In the present invention, one compound selected from the ether bond-containing monohydric alcohols may be used alone, or alternatively two or more such compounds may be used in combination.

(5) Solvent

In the present invention, various organic solvents which, together with, for example, the phenolic resin, the melamine resin and the electroconductive powder, can form a paste composition, may be used as the solvent. Specific examples of preferred organic solvents include butyl carbitol acetate, ethyl acetate, butyl acetate, ethylcellosolve, butylcellosolve, ethyl carbitol, butyl carbitol, isopropanol, butanol, terpineol, texanol, butylcellosolve acetate and isophorone. They may be used either solely or as a mixed solvent composed of two or more of them.

(6) Other Components (Optional Components)

The electroconductive paste composition according to the present invention may if necessary contain various components. Specific examples of such optional components include the following pigments, thixotropy imparting agents, antifoaming agents, dispersants, rust preventive agents, reducing agents, and other resin components compatible with the above phenolic resins and/or melamine resins, for example, epoxy resins and acrylic resins.

Pigment

The electroconductive paste composition according to the present invention may if necessary comprise various organic or inorganic pigments. Such pigments can realize coating film reinforcement, function addition, improved workability, coloring, extending and the like of the electroconductive paste composition.

In the present invention, particularly extender pigments, for example, microsilica, calcium carbonate, barium sulfate, magnesium carbonate, and alumina may be used either solely or as a mixture of two or more.

(7) Mixing Ratio

The mixing ratios of the components in the electroconductive paste composition according to the present invention are as follows. In the following description, the total of the resin components refers to the total amount of the phenolic resin and the melamine resin. When other resins in addition to the phenolic resin and the melamine resin are present, the total of the resin components refers to the total amount of all of these resin components.

The total amount of the monohydric alcohol having an ether bond is preferably 10 to 100 parts by mass, more preferably 30 to 80 parts by mass, still more preferably 40 to 70 parts by mass, based on 100 parts by mass in total of the resin components.

The amount of the electroconductive powder is preferably 300 to 1100 parts by mass, more preferably 500 to 900 parts by mass, based on 100 parts by mass in total of the resin components.

The amount of the pigment is preferably 1 to 30 parts by mass, more preferably 5 to 25 parts by mass, based on 100 parts by mass in total of the resin components.

The mixing ratio between the phenolic resin and the melamine resin in the resin components is preferably 10/90 to 90/10, more preferably 30/70 to 70/30, still more preferably 60/40 to 40/60, in terms of (phenolic resin)/(melamine resin) mass ratio.

The content of the bump forming aid based on 100% by mass in total of the solvent and the bump forming aid is 0.1 to 50% by mass, preferably 0.5 to 40% by mass, more preferably 1 to 30% by mass.

(8) Utilization of Electroconductive Paste Composition

The electroconductive paste composition according to the present invention is highly electroconductive and can be printed on a board by a conventional printing method such as screen printing or metal mask printing. Accordingly, the electroconductive paste composition according to the present invention can be utilized in a wide variety of fields as in the conventional electroconductive paste compositions.

According to the electroconductive paste composition of the present invention, the coating thickness per single printing work is so large that an electroconductive layer having satisfactory thickness can be efficiently formed.

Accordingly, the electroconductive paste composition according to the present invention can form bumps having satisfactory height by a smaller number of times of coating than that in the prior art technique, for example, even by single coating work, contributing to improved productivity.

<Printed Wiring Board>The printed wiring board according to the present invention is characterized by using the above electroconductive paste composition.

In a preferred embodiment of the present invention, in the printing wiring board, interlayer electrical connection has been made by bumps formed from the above electroconductive paste composition.

EXAMPLES

Examples 1 to 3

A phenolic resin, a melamine resin, a silver powder, an extender pigment (microsilica), a bump forming aid, and a solvent were mixed together at a weight ratio specified in Table 1. The mixture was thoroughly kneaded by three-roll kneading to produce an electroconductive paste composition according to the present invention. The viscosity and thixo index of this electroconductive paste composition were as shown in Table 1.

Screen (stencil printing plate) printing was carried out with the electroconductive paste composition. Specifically, a metal mask plate of aluminum with pores of 220 µmɸ0 was provided. Printing was carried out using a urethane resin squeegee having a hardness of 70° at a gap between a screen plate and a surface plate of 2 mm while controlling atmosphere conditions in such a manner that the environment is maintained at a temperature of 20° C. and a humidity of 50% to form bumps.

The height and shapes of the bumps thus formed were evaluated. The results were as described in Table 1.

TABLE 1

| | | Ex. 1 | Ex. 2 | Ex. 3 | Comp. Ex. 1 | Comp. Ex. 2 |
|---|---|---|---|---|---|---|
| Composition | Phenolic resin | 50 | 50 | 50 | 50 | 50 |
| | Melamine resin | 50 | 50 | 50 | 50 | 50 |
| | Silver powder | 700 | 700 | 700 | 700 | 700 |
| | Extender pigment | 10 | 10 | 10 | 10 | 10 |
| | Butyl carbitol acetate | 45 | 45 | 45 | 45 | 45 |

TABLE 1-continued

|  |  | Ex. 1 | Ex. 2 | Ex. 3 | Comp. Ex. 1 | Comp. Ex. 2 |
|---|---|---|---|---|---|---|
|  | 2-Methoxy ethanol | 7.5 | — | — | — | — |
|  | Diethylene glycol monomethyl ether | — | 7.5 | — | — | — |
|  | Triethylene glycol monomethyl ether | — | — | 7.5 | — | — |
|  | Diethylene glycol monoethyl ether | — | — | — | 7.5 | — |
| Properties | Viscosity (Pa · s/25° C.) | 97 | 104 | 152 | 144 | 250 |
|  | Thixotropic index | 0.78 | 0.66 | 0.57 | 0.62 | 0.50 |
|  | Bump height (μm) | 73 | 70 | 75 | 54 | 58 |
|  | Bump shape | Good | Good | Good | Good | Good |

Comparative Examples 1 to 13

Electroconductive paste compositions (Comparative Examples) were produced in the same manner as in Example 1, except that the solvent was used at a mixing ratio specified in Tables 2 and 3 and, further, the bump forming aid was not used. Subsequently, in the same manner as in Example 1, screen printing was carried out, and the height and shape of the bumps thus formed were evaluated. The results were as shown in Tables 2 and 3.

TABLE 2

|  |  | Comp. Ex. 3 | Comp. Ex. 4 | Comp. Ex. 5 | Comp. Ex. 6 | Comp. Ex. 7 |
|---|---|---|---|---|---|---|
| Composition | Phenolic resin | 50 | 50 | 50 | 50 | 50 |
|  | Melamine resin | 50 | 50 | 50 | 50 | 50 |
|  | Silver powder | 700 | 700 | 700 | 700 | 700 |
|  | Extender pigment | 10 | 10 | 10 | 10 | 10 |
|  | Butyl carbitol acetate | 45 | 45 | 45 | 45 | 45 |
|  | 2-Butene-1,4-diol | 7.5 | — | — | — | — |
|  | 1,3-Butanediol | — | 7.5 | — | — | — |
|  | 1,3-Propanediol | — | — | 7.5 | — | — |
|  | 1,5-Pentanediol | — | — | — | 7.5 | — |
|  | 2,3-Butanediol | — | — | — | — | 7.5 |
|  | Propylene glycol | — | — | — | — | — |
|  | 1,2,6-Hexanetriol | — | — | — | — | — |
|  | 1,4-Butanediol | — | — | — | — | — |
|  | 1,2-Butanediol | — | — | — | — | — |
|  | 3-Methyl-1,5-pentanediol | — | — | — | — | — |
|  | 2-Methyl-2,4-pentanediol | — | — | — | — | — |
| Properties | Viscosity (Pa · s/25° C.) | 177 | 171 | 223 | 172 | 153 |
|  | Thixotropic index | 0.82 | 0.69 | 0.92 | 0.60 | 0.54 |
|  | Bump height (μm) | 61 | 54 | 63 | 54 | 57 |
|  | Bump shape | Good | Good | Good | Good | Good |

TABLE 3

|  |  | Comp. Ex. 8 | Comp. Ex. 9 | Comp. Ex. 10 | Comp. Ex. 11 | Comp. Ex. 12 | Comp. Ex. 13 |
|---|---|---|---|---|---|---|---|
| Composition | Phenolic resin | 50 | 50 | 50 | 50 | 50 | 50 |
|  | Melamine resin | 50 | 50 | 50 | 50 | 50 | 50 |
|  | Silver powder | 700 | 700 | 700 | 700 | 700 | 700 |
|  | Extender pigment | 10 | 10 | 10 | 10 | 10 | 10 |
|  | Butyl carbitol acetate | 45 | 45 | 45 | 45 | 45 | 45 |
|  | 2-Butene-1,4-diol | — | — | — | — | — | — |
|  | 1,3-Butanediol | — | — | — | — | — | — |
|  | 1,3-Propanediol | — | — | — | — | — | — |
|  | 1,5-Pentanediol | — | — | — | — | — | — |
|  | 2,3-Butanediol | — | — | — | — | — | — |
|  | Propylene glycol | 7.5 | — | — | — | — | — |
|  | 1,2,6-Hexanetriol | — | 7.5 | — | — | — | — |
|  | 1,4-Butanediol | — | — | 7.5 | — | — | — |
|  | 1,2-Butanediol | — | — | — | 7.5 | — | — |
|  | 3-Methyl-1,5-pentanediol | — | — | — | — | 7.5 | — |
|  | 2-Methyl-2,4-pentanediol | — | — | — | — | — | 7.5 |
| Properties | Viscosity (Pa · s/25° C.) | 162 | 210 | 185 | 150 | 158 | 152 |
|  | Thixotropic index | 0.69 | 0.57 | 0.74 | 0.60 | 0.53 | 0.53 |
|  | Bump height (μm) | 56 | 62 | 57 | 54 | 53 | 57 |
|  | Bump shape | Good | Good | Good | Good | Good | Good |

<Evaluation>

As is apparent from Tables 1 to 3 above, for the electroconductive paste compositions containing a predetermined bump forming aid prepared in Examples 1 to 3, bumps (bump diameter: 220 μm) having a height of 70 μm to 75 μm could be formed, and, as compared with Comparative Example 1 where the bump forming aid according to the present invention was not used (bump height: 54 μm), the height of the bumps was much larger, that is, larger by 30 to 39%. Further, for the electroconductive paste compositions prepared in Examples 1 to 3, the bump shape was conical and good.

On the other hand, for the electroconductive paste compositions prepared in Comparative Examples 2 to 13 where other alcohols were used instead of the bump forming aids used in Examples 1 to 3, the bump shape was round and, in some cases, the bump height was reduced. Further, even when the height of the bumps was increased, the degree of an increase in bump height was merely up to about 16%.

The invention claimed is:

1. An electroconductive paste composition comprising: a phenolic resin; a melamine resin; an electroconductive powder; a solvent; and a bump forming aid comprising a monohydric alcohol having a terminal methoxy group and having at least one ether bond.

2. The electroconductive paste composition according to claim 1, wherein said bump forming aid has an ethylenedioxy moiety in its molecular structure.

3. The electroconductive paste composition according to claim 1, wherein the bump forming aid is at least one member selected from the group consisting of 2-methoxyethanol, diethylene glycol monomethyl ether, and triethylene glycol monomethyl ether.

4. The electroconductive paste composition according to claim 1, wherein said solvent is selected from the group consisting of butyl carbitol acetate, ethyl acetate, butyl acetate, ethylcellosolve, butylcellosolve, ethyl carbitol, butyl carbitol, isopropanol, butanol, terpineol, texanol, butylcellosolve acetate and isophorone.

5. The electroconductive paste composition according to claim 1, wherein the content of the bump forming aid is 0.1 to 50% by mass based on 100% by mass in total of the bump forming aid and the solvent.

6. The electroconductive paste composition according to claim 1, which further comprises a pigment.

7. The electroconductive paste of claim 6, wherein said pigment is an extender pigment.

8. A printed wiring board characterized by using an electroconductive paste composition according to claim 1.

* * * * *